United States Patent [19]
Liu et al.

[11] Patent Number: 5,469,140
[45] Date of Patent: Nov. 21, 1995

[54] TRANSVERSE MAGNETIC FIELD ANNEALED AMORPHOUS MAGNETOMECHANICAL ELEMENTS FOR USE IN ELECTRONIC ARTICLE SURVEILLANCE SYSTEM AND METHOD OF MAKING SAME

[75] Inventors: Nen-chin Liu, Parkland; Ming-Ren Lian, Clearwater; Jimmy Cantey, Fort Lauderdale, all of Fla.

[73] Assignee: Sensormatic Electronics Corporation, Deerfield Beach, Fla.

[21] Appl. No.: 269,651

[22] Filed: Jun. 30, 1994

[51] Int. Cl.$^6$ .................................................... G08B 13/24
[52] U.S. Cl. .................... 340/551; 148/108; 148/311; 148/313; 148/DIG. 3; 29/DIG. 25; 29/DIG. 49; 29/DIG. 95
[58] Field of Search ............................ 340/551; 148/311, 148/313, 108, DIG. 3; 29/DIG. 95, DIG. 49, DIG. 25

[56] References Cited

U.S. PATENT DOCUMENTS

| | | | |
|---|---|---|---|
| 4,510,489 | 4/1985 | Anderson, III et al. | 340/572 |
| 5,252,144 | 10/1993 | Martis | 148/121 |

Primary Examiner—Glen Swann
Attorney, Agent, or Firm—Robin, Blecker, Daley & Driscoll

[57] ABSTRACT

A ribbon-shaped strip of an amorphous magnetic alloy is heat treated, while applying a transverse saturating magnetic field. The treated strip is used in a marker for a pulsed-interrogation electronic article surveillance system. A preferred material for the strip is formed of iron, cobalt, silicon and boron with the proportion of cobalt exceeding 30% by atomic percent.

53 Claims, 4 Drawing Sheets

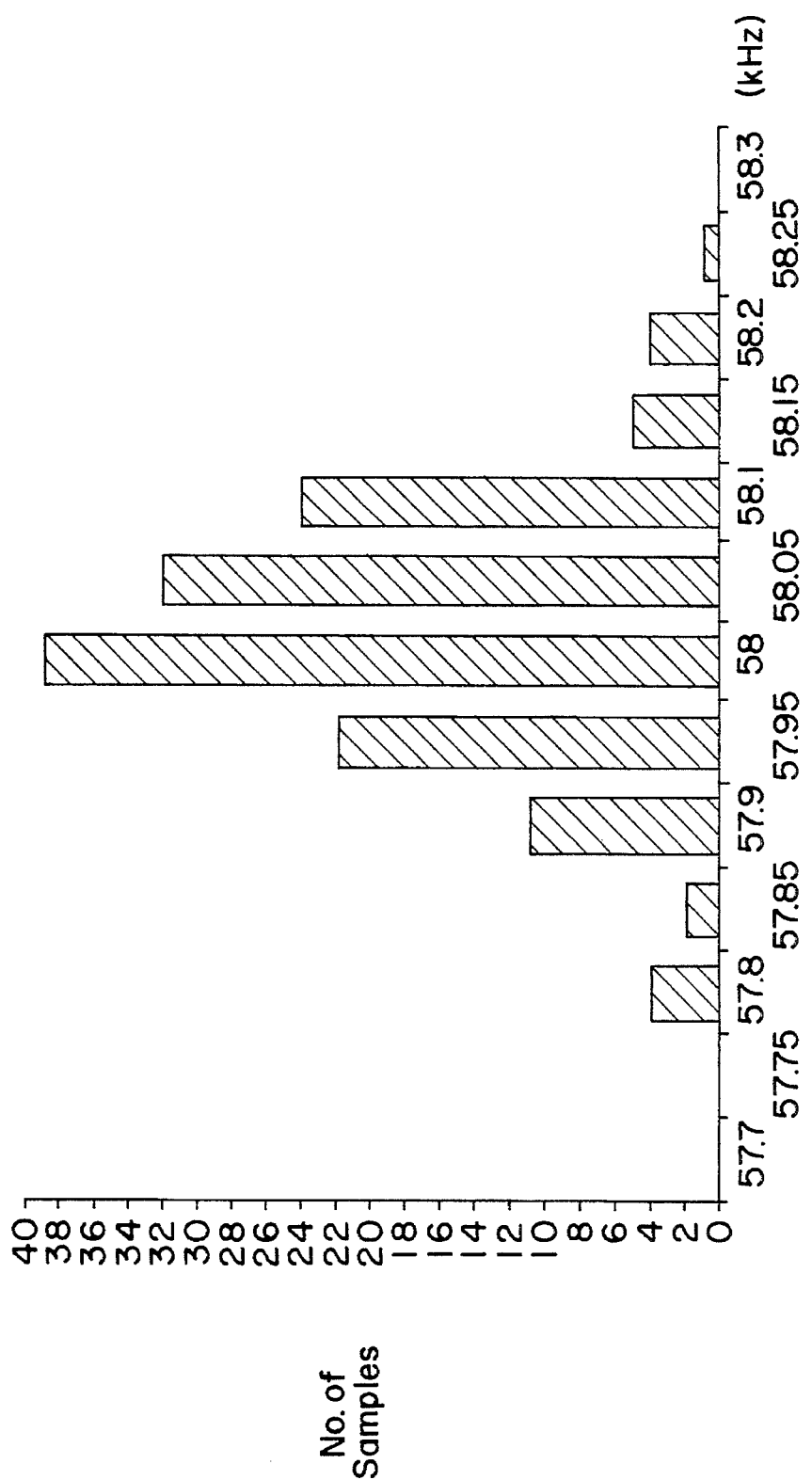

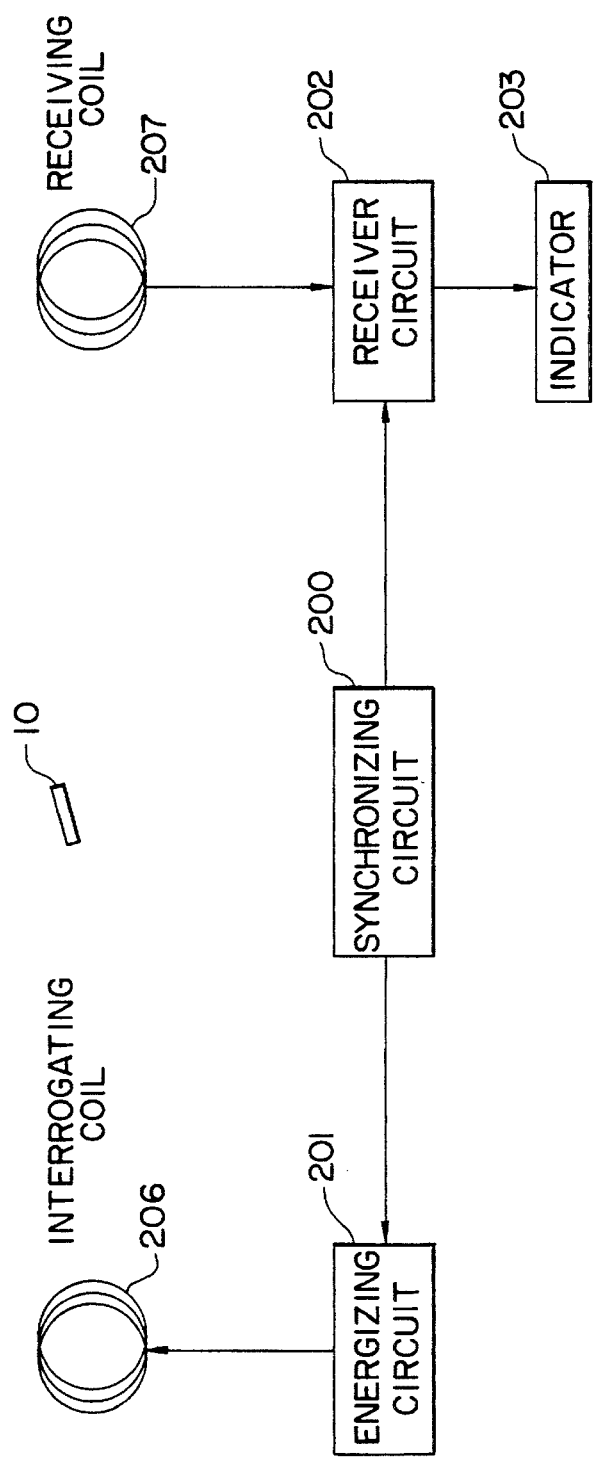
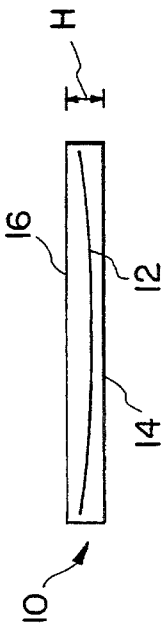
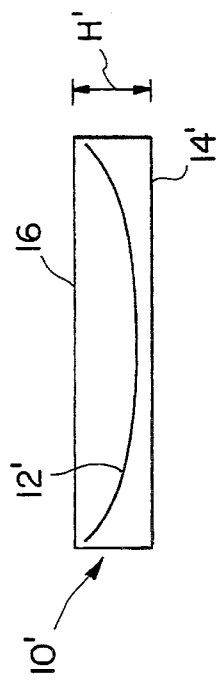

TRANSVERSE MAGNETIC FIELD ANNEALED AMORPHOUS MAGNETOMECHANICAL ELEMENTS FOR USE IN ELECTRONIC ARTICLE SURVEILLANCE SYSTEM AND METHOD OF MAKING SAME

FIELD OF THE INVENTION

This invention relates to magnetomechanical markers used in electronic article surveillance (EAS) systems, and methods of making same.

BACKGROUND OF THE INVENTION

It is well known to provide electronic article surveillance systems to prevent or deter theft of merchandise from retail establishments. In a typical system, markers designed to interact with an electromagnetic or magnetic field placed at the store exit are secured to articles of merchandise. If a marker is brought into the field or "interrogation zone" the presence of the marker is detected and an alarm is generated. Some markers of this type are intended to be removed at the checkout counter upon payment for the merchandise. Other types of markers are deactivated upon checkout by a deactivation device which changes an electromagnetic or magnetic characteristic of the marker so that the marker will no longer be detectable at the interrogation zone.

One type of magnetic EAS system is referred to as a harmonic system because it is based on the principle that a magnetic material passing through an electromagnetic field having a selected frequency disturbs the field and produces harmonic perturbations of the selected frequency. The detection system is tuned to recognize certain harmonic frequencies and, if present, causes an alarm. The harmonic frequencies generated are a function of the degree of non-linearity of the hysteresis loop of the magnetic material.

Another type of EAS system employs magnetomechanical markers that include a magnetostrictive element. For example, U.S. Pat. No. 4,510,489, issued to Anderson et al., discloses a marker formed of a ribbon-shaped length of a magnetostrictive amorphous material contained in an elongated housing in proximity to a biasing magnetic element. The magnetostrictive element is fabricated such that it is resonant at a predetermined frequency when the biasing element has been magnetized to a certain level. At the interrogation zone, a suitable oscillator provides an ac magnetic field at the predetermined frequency, and the marker mechanically resonates at this frequency upon exposure to the field when the biasing element has been magnetized to a certain level.

According to one technique disclosed in the Anderson et al. patent, the marker has, in addition to the aforesaid resonant frequency, an "anti-resonant frequency" at which the stored mechanical energy resulting from magneto-mechanical coupling is near zero. An interrogation circuit which provides the magnetic field at the interrogation zone is swept through a frequency range that includes the marker's resonant and anti-resonant frequencies, and receiving circuitry is provided at the interrogation zone to detect the marker's characteristic signature by detecting a peak transmitted energy level which occurs at the resonant frequency, and a valley level at the anti-resonant frequency.

Anderson et al. also propose that the magnetostrictive element be subjected to annealing over a period of 7–120 mins. at a temperature in the range of about 300°–450° C. in the presence of a saturating transverse magnetic field of a few hundred oersted to enhance a magneto-mechanical coupling factor k which is related to the difference in frequency between the resonant and anti-resonant frequencies of the marker. According to Anderson et al., a larger coupling factor k increases the detectability of the marker's characteristic signature.

In still another surveillance system proposed by Anderson et al., a magnetostrictive marker is used with an interrogation frequency that is not swept, but rather remains at the marker's resonant frequency. The interrogation field at this frequency is provided in pulses or bursts. A marker present in the interrogation field is excited by each burst, and after each burst is over, the marker undergoes a damped mechanical oscillation. The resulting signal radiated by the marker is detected by detecting circuitry which is synchronized with the interrogation circuit and arranged to be active during the quiet periods after bursts. EAS systems of this pulsed-field type are sold by the assignee of this application under the brand name "Ultra*Max" and are in widespread use.

For markers used in pulsed-interrogation systems, the amplitude and duration of oscillations which the member continues to exhibit after the end of each excitation pulse are very important. The greater the amplitude and duration of the residual oscillations (known as "ring down"), the more unique is the signal during the quiet period in the interrogating zone and therefore the easier it is for the marker to be detected by the detecting circuitry.

Deactivation of magnetomechanical markers is typically performed by degaussing the biasing element, so that the magnetostrictive element ceases to be mechanically resonant or its resonant frequency is changed. However, when the biasing element is degaussed, although the marker is no longer detectable in a magnetomechanical surveillance system, the magnetostrictive element may nevertheless act as an amorphous magnetic element which can still produce harmonic frequencies in response to an electromagnetic interrogating field. This is undesirable because after a purchaser of an item bearing the magnetomechanical marker has had the marker degaussed at the checkout counter, that purchaser may then enter another retail shop where a harmonic EAS system may be in use and where it would be possible for the degaussed marker to set off an alarm because it may generate harmonic frequencies in response to an interrogation signal in the second retail store.

The present inventors have found that when conventional magnetostrictive materials used in a pulsed interrogation system are annealed in the presence of a transverse magnetic field, the ring down characteristic of the materials is adversely affected. The time of ring down is substantially reduced thereby rendering the marker less unique as a magnetomechanical marker.

U.S. Pat. No. 5,252,144, issued to Martis, has proposed that various magnetostrictive materials be annealed to improve the ring down characteristics thereof. However, unlike the present invention, the Martis patent does not disclose applying a magnetic field during heating.

OBJECTS AND SUMMARY OF THE INVENTION

It is accordingly a primary object of the invention to provide a magnetomechanical marker that is suitable for use in a pulsed-field EAS interrogation system. It is a further object to provide such a marker that, when deactivated, does not generate harmonic signals of substantial amplitude in response to interrogation by harmonic detection EAS systems.

It is another object of the invention to provide a magnetostrictive marker that is easier to manufacture than conventional magnetomechanical markers.

It is yet another object of the invention to provide a magnetomechanical marker that is thinner than conventional magnetomechanical markers.

It is still another object of the invention to provide a magnetomechanical marker with improved ring down characteristics.

According to an aspect of the invention, an amorphous ferromagnetic material is cut into fixed length strips and then annealed. The annealing process applied to the material includes applying a saturating magnetic field in a direction transverse to the longitudinal axis of a ribbon-shaped member formed of the material, while heating the material and then cooling the material relatively slowly while still in the transverse magnetic field.

According to another aspect of the invention, the material is formed of iron, cobalt, silicon and boron and includes at least 30% cobalt by atomic percent.

According to still another aspect of the invention, the annealing process may include heating the material at a temperature within the range of 300° to 540° C. for at least 5 minutes.

BRIEF DESCRIPTION OF THE DRAWINGS

FIG. 5 is a histogram showing resonant frequencies of a group of samples cut to a uniform length and annealed in accordance with the invention.

FIGS. 6A and 6B are respectively schematic elevational views in section of a marker according to the prior art and a marker according to the invention.

FIG. 7 is a schematic block diagram of an electronic article surveillance system which uses the magnetomechanical marker of FIG. 1.

DESCRIPTION OF THE PREFERRED EMBODIMENTS

Figure 1:
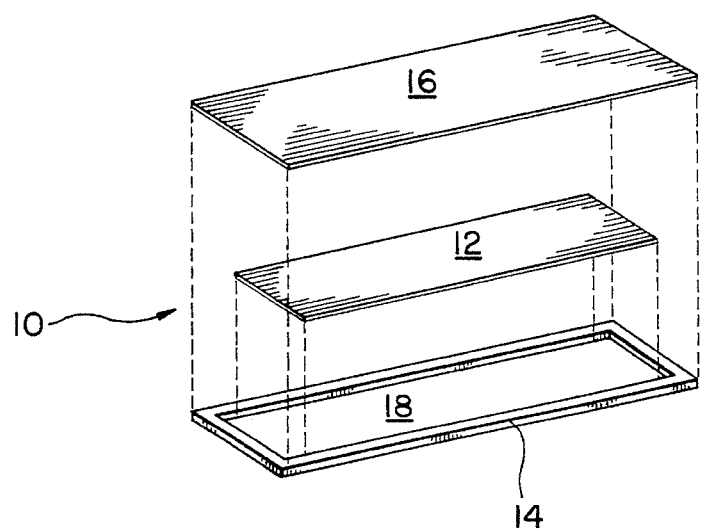
FIG. 1 is an isometric view showing components of a magnetomechanical marker provided in accordance with the present invention.

In the following description the term "magnetostrictive element" refers to the active magnetic component (element 12 shown in FIG. 1) that is capable, when properly activated, of producing a unique ring down signal in response to an interrogation signal. The term "biasing element" refers to a control element (element 16 of FIG. 1) comprised of a magnetic material having a relatively high coercivity, as compared to the coercivity of the magnetostrictive element, and which is capable of being magnetized or demagnetized (i.e., biased or unbiased) to control the mechanical resonant frequency of the magnetostrictive element. The term "marker" (generally indicated by reference numeral 10 in FIG. 1) refers to the combination of the magnetostrictive element 12 and the biasing element 16 usually contained within a housing (element 14 in FIG. 1) and capable of being attached or associated with merchandise to be protected from theft.

Conventional materials used in the prior art, such as Metglas® 2826 MB (which has a composition of $Fe_{40}Ni_{38}Mo_4B_{18}$), are used as magnetostrictive elements in markers without annealing. Annealing such materials tends to reduce the ring down period, which tends to make such materials, if annealed, unsuitable for use in pulsed-field magnetomechanical EAS systems.

In accordance with the invention, a material that is rich in cobalt is cut into strips having a uniform fixed length. The strips are annealed to provide a magnetostrictive element to be used in fabricating a marker for a pulsed-field EAS system. A preferred material according to the invention is an amorphous ribbon of Fe-Co base alloy, for example, $(Fe_{0.5}Co_{0.5})_{79}Si_6B_{15}$ or $(Fe_{0.5}Co_{0.5})_{79}Si_2B_{19}$. It is believed that Fe-Co alloys containing at least 30% Co by atomic percent will produce satisfactory results. For example, alloys containing a combined proportion of iron and cobalt of at least 70%, with at least 30% cobalt, by atomic percent, and the balance silicon and boron, are believed to be suitable. The combined proportion of iron and cobalt in such suitable alloys may exceed 90%, and it is believed that the maximum combined proportion of iron and cobalt is only limited by the need to include sufficient silicon and boron so that the alloy can be cast in amorphous form.

In a preferred embodiment, the material is cast as a ribbon that is 0.5 in. wide. The ribbon is cut before annealing into uniform lengths of 1.56 in. to obtain a resonant frequency of 58 KHz (corresponding to conventional pulsed-field detection equipment) upon application of a conventional dc magnetic biasing field.

Although it is preferred to apply the invention to a material that has been cast as a ribbon, it is also possible to use materials in other strip shapes, including wires, for example. Annealing is carried out in accordance with the invention using a strong (saturating) dc magnetic field applied transversely to the longitudinal axis of the cut ribbon strips. In the presence of this magnetic field, the ribbon strips are heated at a temperature of 300° to 540° C. for a period of 5 to 60 minutes and then allowed to cool to room temperature, while maintaining the magnetic field at least until the material has cooled to below 200° C. The method by which cooling is performed is not of great significance as long as the cooling is not too rapid. For example, it is believed that cooling to room temperature in less than two minutes will not produce optimum results, and it is therefore better that cooling not take place simply by immediate exposure to open air. According to a preferred technique, the material is cooled by being conveyed through an unheated but enclosed tube to permit cooling to room temperature to take place over a period of at least two minutes.

Figure 2:
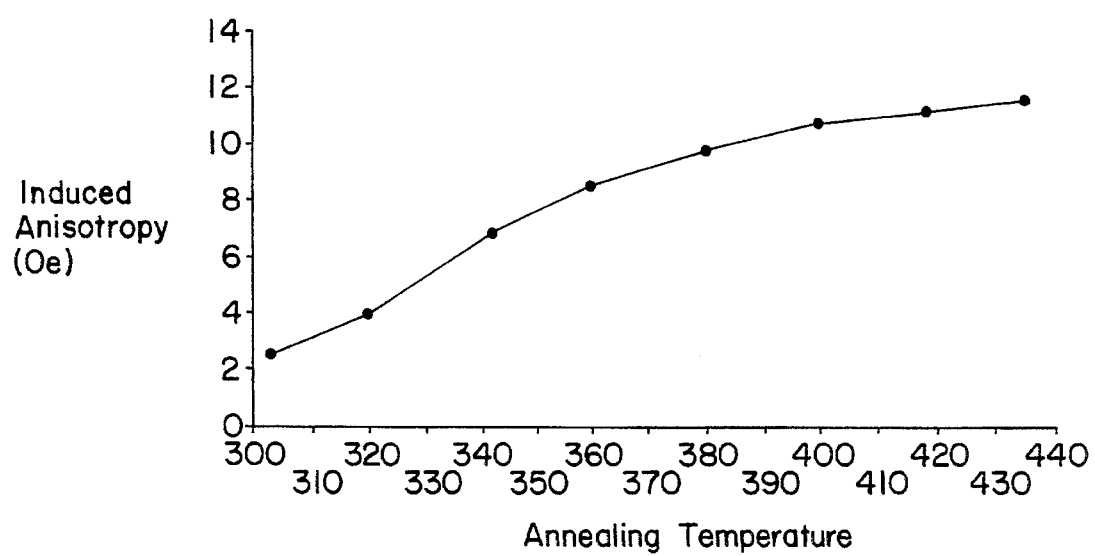
FIG. 2 is a graph showing amounts of induced anisotropy over a range of annealing temperatures.

FIG. 2 illustrates how the degree of anisotropy induced by annealing varies with the annealing temperature. Specifically, the abscissa axis in FIG. 2 is indicative of the annealing temperature, while the ordinate axis indicates the degree of anisotropy induced, represented by the strength of field that would be required to overcome the anisotropy. It is within the contemplation of the present invention to use annealing temperatures in the range 300° C. up to about 540° C. A preferred temperature range would be 390° C.–500° C. Satisfactory results have been obtained with an annealing temperature of 450° C. applied for about 7½ minutes, with cooling to room temperature over a period of about 7½ minutes As indicated above, the transverse saturating magnetic field is maintained during both heating and cool down. The required minimum strength of the transverse magnetic field applied during annealing and cool down periods depends on the particular material being treated. The field should be strong enough to be saturating for the particular material. For most materials discussed above, the optimum field will be in excess of 500 Oe, and a field of 800 Oe or more will often be necessary to achieve saturation. Increasing the field strength beyond that required for saturation is contemplated by the invention but causes no adverse or beneficial effect.

It is to be noted that the annealing temperature should not be so high, nor the period of treatment so long, that more than a minimal amount of crystallization occurs, since severe crystallization tends to adversely affect ring down characteristics and imparts an undesirable degree of brittleness.

Magnetostrictive strips formed in accordance with the invention can be incorporated in markers that are of substantially the same construction as conventional magnetomechanical markers. For example, as shown in FIG. 1, a marker 10 may be formed in accordance with the present invention from a magnetostrictive strip 12 which has been fabricated and treated as described above, a rigid housing 14 formed of a polymer such as polyethylene, and a biasing element 16. The components making up the marker 10 are assembled so that the magnetostrictive strip 12 rests within a recess 18 of the housing 14, and the biasing element 16 is held in the housing 14 so as to form a cover for the recess 18. It will be understood that the recess 18 and the magnetostrictive strip 12 are relatively sized so that the mechanical resonance of the strip 12, caused by exposure to a suitable magnetic field, is not mechanically inhibited or damped by the housing 14 or the biasing element 16.

The length to which the strips are cut is selected, according to a preferred practice, to produce a marker that is resonant at 58 KHz, to provide compatibility with existing detection equipment, while using a conventional biasing element 16, magnetized at a level used in conventional magnetomechanical markers.

A marker 10 fabricated in accordance with the invention may be deactivated in a conventional manner by degaussing the biasing element 16, so that the marker 10 is "detuned" and therefore is no longer responsive to the predetermined interrogation frequency.

Figure 3:
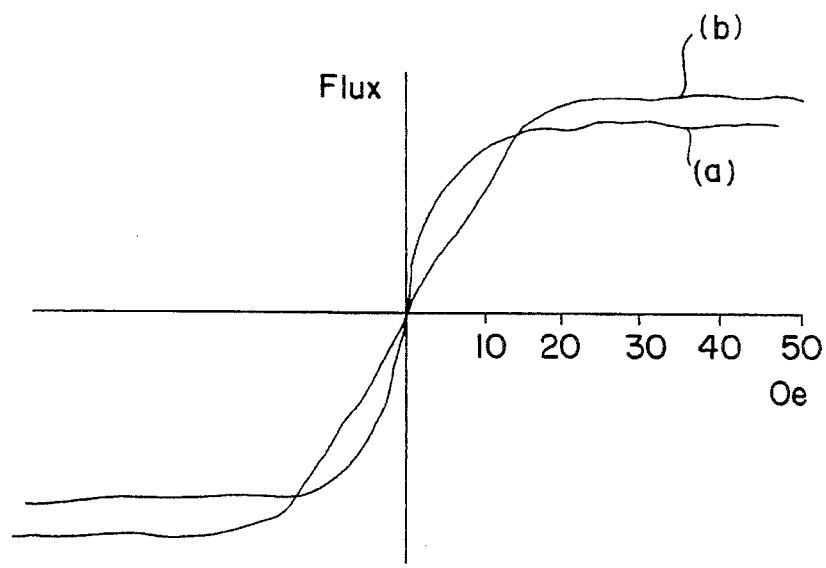
FIG. 3 illustrates respective hysteresis characteristics of a prior art magnetostrictive marker and a marker fabricated according to the present invention.

As shown in FIG. 3, a marker 10 which incorporates a magnetostrictive strip formed and treated in accordance with the present application, has a hysteresis characteristic indicated by the curve (b) in FIG. 3. It is to be noted that this characteristic is considerably more linear and less steep, for relatively small applied magnetic fields (less than 10 Oe), than the characteristic illustrated by curve (a), which is exhibited by markers incorporating conventional magnetostrictive strips, such as untreated (as cast) strips formed of the alloy Metglas® 2826MB marketed by Allied Corporation. As a result, markers fabricated in accordance with the present invention, when deactivated in the magnetomechanical EAS system by degaussing, generate a much lower harmonic signal in response to interrogation fields provided by conventional harmonic detection EAS systems, and are therefore much less likely to occasion alarms by harmonic systems than a conventional deactivated magnetostrictive type marker. For example, a degaussed marker prepared according to the present invention provides a reduction of at least about 60 dB in harmonic generation, upon exposure to an interrogation signal, as compared to a marker used in the conventional harmonic detection EAS system marketed by the assignee of the present application under the trademark "AisleKeeper". Although a preferred practice of the invention achieved a 60 dB reduction in harmonic generation, it is believed that a reduction in harmonic generation of about 20 dB would be sufficient to achieve the purpose of substantially eliminating alarms by harmonic detection EAS systems in response to deactivated magnetomechanical markers. It will be understood that the annealing process serves to smooth the hysteresis characteristic of the material by reducing nonlinearity therein.

Figure 4:
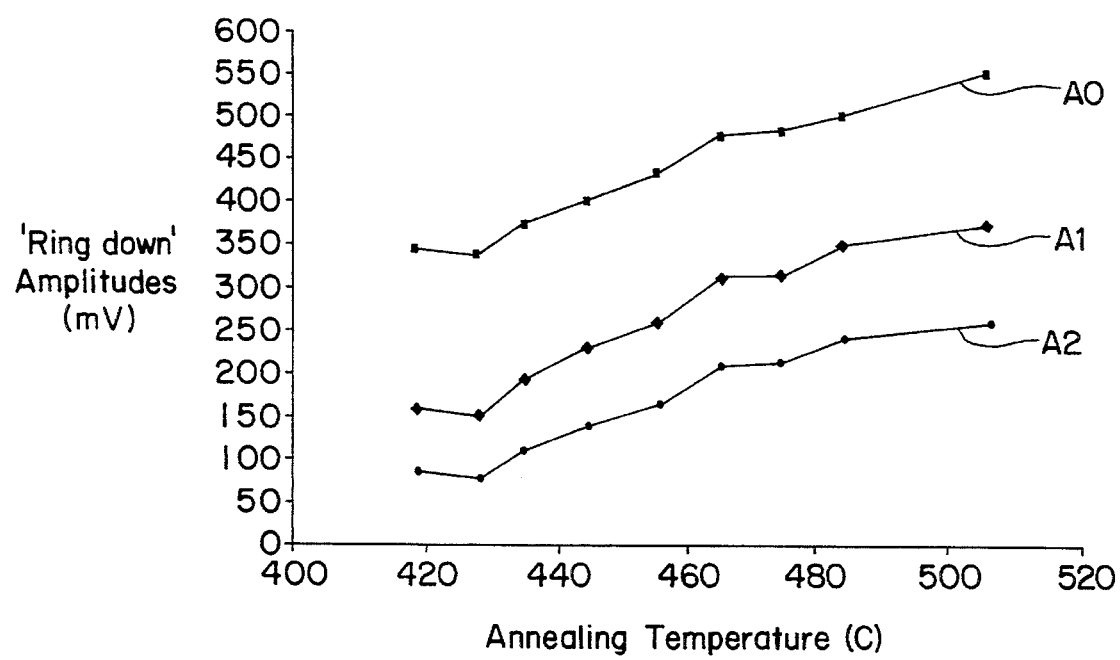
FIG. 4 is a graph showing respective ring down characteristics obtained over a range of annealing temperatures.

Another advantage of the present invention is that markers which include magnetostrictive materials formed as described herein provide more favorable ring down characteristics than conventional markers using the as-cast Metglas material referred to above. In particular, FIG. 4 illustrates the superior ring down amplitudes realized with markers constructed with magnetostrictive strips treated in accordance with the invention using a range of annealing temperatures. The curve A0 shown in FIG. 4 is illustrative of amplitudes of the radiated signal obtained from the marker immediately after the end of the excitation pulse, curve A1 represents the amplitudes obtained 1 msec after the end of the pulse, and curve A2 represents the amplitudes obtained 2 msec after the end of the pulse. The results shown in FIG. 4 reflect an annealing time of 30 minutes. The biasing field during interrogation was 5 Oe. FIG. 4 indicates that, over the range of about 410°–510° C., higher ring down amplitudes are obtained by using higher annealing temperatures. In general these amplitudes are higher than the amplitudes provided by the conventional markers using as-cast Metglas as the magnetostrictive material.

Still another advantage provided by the treatment disclosed herein is improved consistency in terms of the resonant frequency of the magnetostrictive strips.

Because of variations in conventional as cast magnetostrictive materials, cutting the material into strips of uniform fixed length does not necessarily result in markers that all have the desired mechanical resonant frequency. If a marker does not have a resonant frequency that is sufficiently close to the frequency of the interrogation field, the marker will not be adequately excited by the interrogation field. The variations in the conventional magnetostrictive materials is so great that in one process it is necessary to measure the resonant frequency of each strip. If required, the length to which each strip is cut, after the third strip of a batch, is adjusted based on the measured resonant frequencies of the previous three strips. In general, the cut length must be adjusted often, sometimes for every strip, and generally after no more than five or six strips. Thus, to compensate for the variation in the conventional as cast material, the conventional processes for manufacturing magnetostrictive elements includes frequent testing of the resonant frequency of the cut strips, and then adjusting the length to which the strips must be cut to obtain the desired resonant frequency.

However, this invention produces magnetostrictive elements that exhibit quite consistent resonant frequencies for a preselected strip length. It is believed that the greater consistency provided by the present technique results because the present annealing technique can be controlled to produce a consistent degree of anisotropy, whereas the anisotropy of the conventional as cast materials is a product of the composition resulting from the casting process, which is inherently subject to variation.

As shown in FIG. 5, in a sample of approximately 150 strips, which were all cut to a uniform length (1.56 in.), heat treated in accordance with the present invention (7.5 minutes at 450° C. with a saturating transverse dc magnetic field) and then subjected to a biasing field of 5 oersteds and tested for resonant frequency, nearly all of the strips had a resonant frequency within a 200 Hz range around the desired resonant frequency of 58 KHz. This high degree of consistency provides increased yield, and makes it unnecessary either to test for variations in resonant frequency or to compensate for such variations by periodically adjusting the length of the strips, as is required when the conventional Metglas material is used.

Yet another advantage provided by the present invention is that the annealing process disclosed herein produces magnetostrictive strips that are relatively flat as compared to the conventional as-cast magnetostrictive strips. For example, FIG. 6A shows a marker 10' in accordance with the prior art, including an as-cast magnetostrictive strip 12'. As somewhat schematically illustrated in FIG. 6A, there is a significant degree of curling in the strip 12' believed to be due to residual stress. Therefore, the housing 14' provided for a conventional marker 10' must have a relatively great height H' to accommodate the curled strip 12' without inhibiting the desired magnetomechanical resonance of the strip. If the conventional strip is annealed to relieve stress, it has been found that the unique ring down signal is substantially reduced.

However, as shown in FIG. 6B, the strip 12 prepared in accordance with the present disclosure is essentially flat, and has only minimal curling, so that the housing 14 provided in accordance with the present invention can have a much lower profile than the conventional marker 10' and a height H that is much less than the height H' of the conventional marker. For example, a housing 14' having H'=70 to 110 mils may be needed to accommodate a conventional 1 mil thick Metglas strip 12' but the housing 14 need only have H=5 to 30 mils to accommodate a 1 mil thick strip 12 treated in accordance with the present invention. This provides for a thinner marker that is more conveniently attached to merchandise. Markers that are thinner or less bulky are much more desirable. The overall thickness of the housing for a marker is also dependent on the thickness and uniformity of the material used to form the housing.

It should be noted that the annealing process described herein can also be used to form magnetostrictive strips into desired curved shapes, rather than the flat strip shown in FIG. 6B.

FIG. 7 illustrates a pulsed-interrogation EAS system which uses the magneto-mechanical marker fabricated in accordance with the invention. The system shown in FIG. 7 includes a synchronizing circuit 200 which controls the operation of an energizing circuit 201 and a receiving circuit 202. The synchronizing circuit 200 sends a synchronizing gate pulse to the energizing circuit 201, and the synchronizing gate pulse activates the energizing circuit 201. Upon being activated, the energizing circuit 201 generates and sends an interrogation signal to interrogating coil 206 for the duration of the synchronizing pulse. In response to the interrogation signal, the interrogating coil 206 generates an interrogating magnetic field, which, in turn, excites the marker 10 into mechanical resonance.

Upon completion of the pulsed interrogating signal, the synchronizing circuit 200 sends a gate pulse to the receiver circuit 202, and the latter gate pulse activates the circuit 202. During the period that the circuit 202 is activated, and if a marker is present in the interrogating magnetic field, such marker will generate in the receiver coil 207 a signal at the frequency of mechanical resonance of the marker. This signal is sensed by the receiver 202, which responds to the sensed signal by generating a signal to an indicator 203 to generate an alarm or the like. In short, the receiver circuit 202 is synchronized with the energizing circuit 201 so that the receiver circuit 202 is only active during quiet periods between the pulses of the pulsed interrogation field.

Various other changes in the foregoing markers and modifications in the described practices may be introduced without departing from the invention. The particularly preferred embodiments of the invention are thus intended in an illustrative and not limiting sense. The true spirit and scope of the invention is set forth in the following claims.

What is claimed is:

1. A marker for use in a magnetomechanical electronic article surveillance system, comprising an amorphous magnetostrictive strip formed of an alloy of iron and cobalt in which the proportion of cobalt is at least 30% by atomic percent.

2. A marker according to claim 1, wherein said alloy has a combined proportion of iron and cobalt of at least 70% by atomic percent.

3. A marker according to claim 2, wherein said alloy includes sufficient proportions of silicon and boron to permit said alloy to be cast in amorphous form.

4. A marker according to claim 3, wherein the respective proportions of iron and cobalt in said alloy are substantially equal by atomic percent.

5. A marker according to claim 4, wherein said alloy is essentially one of $(Fe_{0.5}Co_{0.5})_{79}Si_6B_{15}$ and $(Fe_{0.5}Co_{0.5})_{79}Si_2B_{19}$.

6. A marker according to claim 1, wherein said amorphous strip is substantially ribbon-shaped.

7. A method of fabricating a marker for use in a magnetomechanical electronic article surveillance system, comprising the steps of:

providing an amorphous magnetostrictive element formed of an alloy of iron and cobalt in which the proportion of cobalt is at least 30% by atomic percent; and mounting the magnetostrictive element in a mounting means in proximity to a biasing element which provides a dc magnetic biasing field for the magnetostrictive element so that the magnetostrictive element has a predetermined magnetomechanical resonant frequency.

8. A method according to claim 7, wherein said alloy has a combined proportion of iron and cobalt of at least 70% by atomic percent.

9. A method according to claim 7, wherein said amorphous magnetostrictive element is substantially ribbon-shaped.

10. A magnetomechanical electronic article surveillance system comprising:

(a) generating means for generating an electromagnetic field alternating at a selected frequency in an interrogation zone, said generating means including an interrogation coil;

(b) a marker secured to an article appointed for passage through said interrogation zone, said marker including an amorphous magnetostrictive element formed of an alloy of iron and cobalt in which the proportion of cobalt is at least 30% by atomic percent, said marker also including a biasing element located adjacent to said magnetostrictive element, said biasing element being magnetically biased to cause said magnetostrictive element to be mechanically resonant when exposed to said alternating field; and (c) detecting means for detecting said mechanical resonance of said magnetostrictive element.

11. A magnetomechanical electronic article surveillance system according to claim 10, wherein said alloy has a combined proportion of iron and cobalt of at least 70% by atomic percent.

12. A magnetomechanical electronic article surveillance system according to claim 10, wherein said amorphous magnetostrictive element is substantially ribbon-shaped.

13. A method of fabricating a marker for use in a magnetomechanical electronic article surveillance system, the method comprising the steps of:

applying a saturating magnetic field to an amorphous magnetic element;

heating said element at a temperature in the range of 460° to 540° C. for at least 5 minutes during application of said magnetic field; and allowing the annealed element to cool to room temperature.

14. A method according to claim 13, wherein said amorphous magnetic element is a ribbon and has a longitudinal axis, and said saturating magnetic field is applied transversely to said longitudinal axis of said element.

15. A method according to claim 14, further comprising the step of mounting the annealed and cooled element in a mounting means in proximity to a magnetic element which provides a dc magnetic biasing field for the element so that the element has a predetermined magnetomechanical resonant frequency.

16. A method according to claim 13, wherein said amorphous magnetic element is an alloy of iron and at least 30% cobalt by atomic percent.

17. A method according to claim 16, wherein said amorphous magnetic element consists essentially of one of $(Fe_{0.5}Co_{0.5})_{79}Si_6B_{15}$ and $(Fe_{0.5}Co_{0.5})_{79}Si_2B_{19}$.

18. A marker for use in a magnetomechanical electronic article surveillance system, comprising a magnetostrictive element formed by annealing an amorphous magnetic member by applying a saturating magnetic field to said member while heating said member at a temperature in the range of 460° C. to 540° C. for at least 5 minutes.

19. A marker according to claim 18, wherein said amorphous magnetic element is substantially ribbon-shaped.

20. A marker according to claim 18, wherein said amorphous magnetic element is an alloy of iron and at least 30% cobalt by atomic percent.

21. A magnetomechanical electronic article surveillance system comprising:

(a) generating means for generating an electromagnetic field alternating at a selected frequency in an interrogation zone, said generating means including an interrogation coil;

(b) a marker secured to an article appointed for passage through said interrogation zone, said marker including an amorphous magnetostrictive element formed by annealing an amorphous magnetic member by applying a saturating magnetic field to said member while heating said member at a temperature in the range of 460° C. to 540° C. for at least 5 minutes, said marker also including a biasing element located adjacent to said magnetostrictive element, said biasing element being magnetically biased to cause said magnetostrictive element to be mechanically resonant when exposed to said alternating field; and (c) detecting means for detecting said mechanical resonance of said magnetostrictive element.

22. A magnetomechanical electronic article surveillance system according to claim 21, wherein said amorphous magnetostrictive element is substantially ribbon-shaped.

23. A magnetomechanical electronic article surveillance system according to claim 21, wherein said amorphous magnetostrictive element is an alloy of iron and at least 30% cobalt by atomic percent.

24. A marker for use in a magnetomechanical electronic article surveillance system, comprising:

(a) an amorphous magnetostrictive element;

(b) a biasing element located adjacent to said magnetostrictive element;

(c) said magnetostrictive element and said biasing element being contained within a housing;

(d) the overall thickness of said housing being less than 0.065 inches.

25. A marker according to claim 24, wherein the overall thickness of said housing is less than 0.030 inches.

26. A marker according to claim 24, wherein the overall thickness of said housing is about 0.005 inches.

27. A marker according to claim 24, wherein said magnetostrictive element is formed of an alloy that comprises iron and at least 30% cobalt by atomic percent.

28. A method of making a marker for use in a magnetomechanical electronic article surveillance system, the method comprising the steps of:

(a) applying a saturating magnetic field to an amorphous magnetostrictive element formed of an alloy that comprises iron and at least 30% cobalt by atomic percent;

(b) heating said element at a temperature in the range of 300° to 540° C. for at least 5 minutes during application of said magnetic field;

(c) allowing the annealed element to cool to room temperature; and (d) mounting said cooled magnetostrictive element and a biasing element within a housing that has an overall thickness of less than 0.065 inches.

29. A method according to claim 28, wherein said housing has an overall thickness of less than 0.030 inches.

30. A method according to claim 29, wherein said housing has an overall thickness of about 0.005 inches.

31. A magnetomechanical electronic article surveillance system comprising:

(a) generating means for generating an electromagnetic field alternating at a selected frequency in an interrogation zone, said generating means including an interrogation coil;

(b) a marker secured to an article appointed for passage through said interrogation zone, said marker including an amorphous magnetostrictive element and a biasing element located adjacent to said magnetostrictive element, said magnetostrictive element and said biasing element being contained within a housing, the overall thickness of said housing being less than 0.065 inches, said biasing element being magnetically biased to cause said magnetostrictive element to be mechanically resonant when exposed to said alternating field; and (c) detecting means for detecting said mechanical resonance of said magnetostrictive element.

32. A magnetomechanical electronic article surveillance system according to claim 31, wherein said housing has an overall thickness of less than 0.030 inches.

33. A magnetomechanical electronic article surveillance system according to claim 32, wherein said housing has an overall thickness of about 0.005 inches.

34. A magnetomechanical electronic article surveillance system according to claim 31, wherein said generating means operates to generate said alternating field in a pulsed fashion and said magnetostrictive element produces mechanical perturbations that are detectable by said detecting means during a period of time after the alternating field has stopped.

35. A magnetomechanical electronic article surveillance system according to claim 31, wherein said magnetostrictive element is formed of an alloy that comprises iron and at least 30% cobalt by atomic percent.

36. A marker for use in a magnetomechanical electronic article surveillance system, comprising:
  (a) an amorphous magnetostrictive element;
  (b) a biasing element located adjacent said magnetostrictive element; and
  (c) said magnetostrictive element having a hysteresis loop characteristic such that said magnetostrictive element does not produce detectable harmonic frequencies when in an alternating electromagnetic field.

37. A marker according to claim 36, wherein said biasing element is magnetically biased to cause said magnetostrictive element to be mechanically resonant when exposed to a pulsed electromagnetic field alternating at a selected frequency.

38. A marker according to claim 37, wherein said magnetostrictive element is mechanically resonant and produces mechanical perturbations at a frequency detectable by a receiver tuned to said frequency during a period of time after the alternating electromagnetic field has stopped; and
  said magnetostrictive element is incapable of producing mechanical perturbations at said frequency detectable by said receiver during the period of time after the alternating electromagnetic field has stopped when said biasing element is in a degaussed condition.

39. A method of making a marker for use in a magnetomechanical electronic article surveillance system, the method comprising the steps of:
  (a) making an amorphous magnetostrictive element; and
  (b) mounting said magnetostrictive element adjacent to a biasing element;
  said magnetostrictive element having a hysteresis loop characteristic such that said magnetostrictive element does not produce detectable harmonic frequencies when in an alternating electromagnetic field.

40. A method according to claim 39, wherein said biasing element is magnetically biased to cause said magnetostrictive element to be mechanically resonant when exposed to a pulsed electromagnetic field alternating at a selected frequency.

41. A method according to claim 40, wherein said magnetostrictive element is mechanically resonant and produces mechanical perturbations at a frequency detectable by a receiver tuned to said frequency during a period of time after the alternating electromagnetic field at said selected frequency has stopped; and
  said magnetostrictive element is incapable of producing mechanical perturbations at said frequency detectable by said receiver during the period of time after the alternating electromagnetic field has stopped when said biasing element is in a degaussed condition.

42. A magnetomechanical electronic article surveillance system comprising:
  (a) generating means for generating an electromagnetic field alternating at a selected frequency in an interrogation zone, said generating means including an interrogation coil;
  (b) a marker secured to an article appointed for passage through said interrogation zone, said marker including an amorphous magnetostrictive element and a biasing element located adjacent to said magnetostrictive element, said magnetostrictive element having a hysteresis loop characteristic such that said magnetostrictive element does not produce detectable harmonic frequencies when in an alternating electromagnetic field, said biasing element being magnetically biased to cause said magnetostrictive element to be mechanically resonant when exposed to said alternating field at said selected frequency; and
  (c) detecting means for detecting said mechanical resonance of said magnetostrictive element.

43. A magnetomechanical electronic article surveillance system according to claim 42, wherein said generating means operates to generate said alternating field at said selected frequency in a pulsed fashion and said magnetostrictive element produces mechanical perturbations that are detectable by said detecting means during a period of time after the alternating field at said selected frequency has stopped.

44. A magnetomechanical electronic article surveillance system according to claim 43, wherein said magnetostrictive element is incapable of producing mechanical perturbations detectable by said detecting means during the period of time after the alternating electromagnetic field at said selected frequency has stopped when said biasing element is in a degaussed condition.

45. A method of forming a magnetostrictive element, the method comprising the steps of:
  (a) providing an amorphous magnetic material; and
  (b) heat treating said material in the presence of a saturating magnetic field, said heat treating being performed so as to smooth a hysteresis characteristic of said material.

46. A method according to claim 45, wherein said amorphous magnetic material is formed as a ribbon-shaped strip having a longitudinal axis and said magnetic field is applied to said material substantially transversely of said longitudinal axis.

47. A method according to claim 46, further comprising the step of cooling said material after said heat treating step by conveying said material through an unheated enclosed area, so that said material cools to room temperature over a period of at least two minutes.

48. A method of making a magnetostrictive element for use as a marker in a magnetomechanical electronic article system comprising:
  (a) selecting an amorphous magnetic material;
  (b) cutting the said material to a strip having a fixed uniform length preselected to ultimately make the strip mechanically resonant at a desired frequency;
  (c) annealing the said strip at a temperature between 300° C. and 540° C. for a period of time between 2 and 60 minutes in a transverse magnetic field having a strength of at least 500 oersteds; and
  (d) cooling said strip to room temperature for a period of not less than two minutes in a transverse magnetic field having a strength of at least 500 oersteds;
  whereby said strip exhibits magnetostrictive properties having the said desired mechanical resonant frequency and has a unique detectable signal during a ring down period.

49. A method according to claim 48, wherein said material has a composition that includes iron, cobalt, silicon and boron with cobalt being present to at least 30% by atomic weight.

50. A method according to claim 48, wherein said cutting step is performed by cutting the material to form a batch of strips cut to said preselected fixed uniform length, said batch including at least 10 strips.

51. A method according to claim 50, wherein said batch includes at least 50 strips.

52. A marker for use in a magnetomechanical electronic article surveillance system, comprising a magnetostrictive element made by selecting an amorphous magnetic material, cutting said material to a strip having a fixed uniform length preselected to ultimately make the strip mechanically resonant at a desired frequency, annealing the said strip at a temperature between 300° C. and 540° C. for a period of time between 2 and 60 minutes in a transverse magnetic field, and cooling said strip to room temperature over a period of not less than two minutes in a transverse magnetic field having a strength of at least 500 oersteds;

wherein said strip exhibits magnetostrictive properties having the said desired mechanical resonant frequency and has a unique detectable signal during a ring down period.

53. A magnetomechanical electronic article surveillance system comprising:

(a) generating means for generating an electromagnetic field alternating at a selected frequency in an interrogation zone, said generating means including an interrogation coil;

(b) a marker secured to an article appointed for passage through said interrogation zone, said marker including a magnetostrictive strip made by selecting an amorphous magnetic material, cutting said material to a strip having a fixed uniform length preselected to ultimately make the strip mechanically resonant at said selected frequency, annealing the said strip at a temperature between 300° C. and 540° C. for a period of time between 2 and 60 minutes in a transverse magnetic field having a strength of at least 500 oersteds and cooling said strip to room temperature over a period of not less than two minutes in a transverse magnetic field having a strength of at least 500 oersteds, said marker also including a biasing element located adjacent to said magnetostrictive strip, said biasing element being magnetically biased to cause said magnetostrictive strip to be mechanically resonant when exposed to said alternating field, said magnetostrictive strip having a unique signal during a ring down period; and (c) detecting means for detecting said unique signal of said magnetostrictive strip.

* * * * *